United States Patent [19]

Delgrange et al.

[11] Patent Number: 4,652,796
[45] Date of Patent: Mar. 24, 1987

[54] CONTROL CIRCUIT FOR AN ALTERNATE TYPE PLASMA PANEL

[75] Inventors: Louis Delgrange; Françoise Vialettes, both of St. Egreve, France

[73] Assignee: Thomson-Csf, Paris, France

[21] Appl. No.: 653,919

[22] Filed: Sep. 24, 1984

[30] Foreign Application Priority Data

Sep. 27, 1983 [FR] France ................................ 83 15334

[51] Int. Cl.⁴ ............................................. G09G 3/10
[52] U.S. Cl. .................................................. 315/169.4
[58] Field of Search ....................................... 315/169.4

[56] References Cited

U.S. PATENT DOCUMENTS

| | | | |
|---|---|---|---|
| 3,851,210 | 11/1974 | Schermerhorn | 340/779 |
| 3,997,813 | 5/1977 | Chan et al. | 340/806 |
| 4,140,945 | 2/1979 | Trogdon | 315/169.4 |
| 4,384,287 | 5/1983 | Sakuma | 340/771 |

FOREIGN PATENT DOCUMENTS 069524 1/1983 European Pat. Off. .
78193 5/1983 European Pat. Off. ......... 315/169.4

OTHER PUBLICATIONS

"Plasma Display" by Yano et al., pp. 54–63, NEC Research & Development (Japan) No. 30, Jul. 1973.
Sid International Symposium Digest of Technical Papers, mai 1976, J. W. V. Miller et al., Lere Edition, pp. 58–59, Lewis Winner, New York (USA); "5.5: Bipolar . . .".

Primary Examiner—Harold Dixon
Attorney, Agent, or Firm—Roland Plottel

[57] ABSTRACT

In an alternate type plasma panel, the low voltage/high voltage interface circuits of the integrated circuits associated to the second network of electrodes are supplied in high voltage by the two amplifiers associated to each of these integrated circuits. During elaboration of the writing and erasure signals, one of the amplifiers supplies the voltage to be applied to the selected electrodes, to write or to erase, while the other amplifier supplies the voltage to be applied to the non selected electrodes.

12 Claims, 12 Drawing Figures

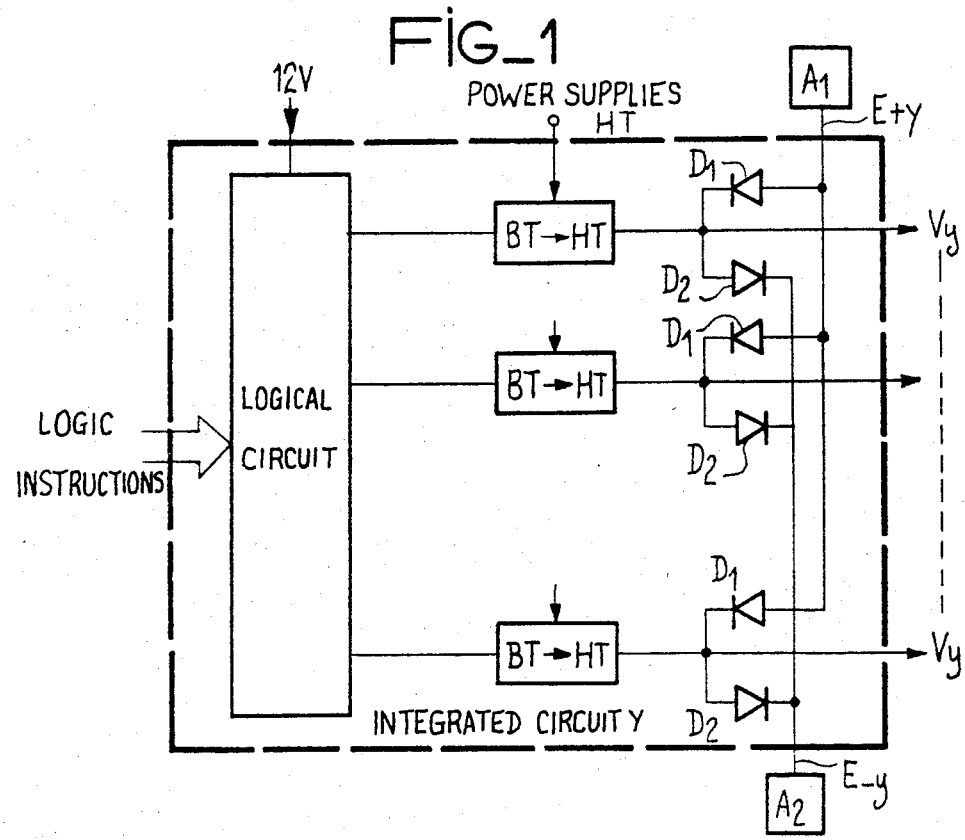
PRIOR ART FIG_1
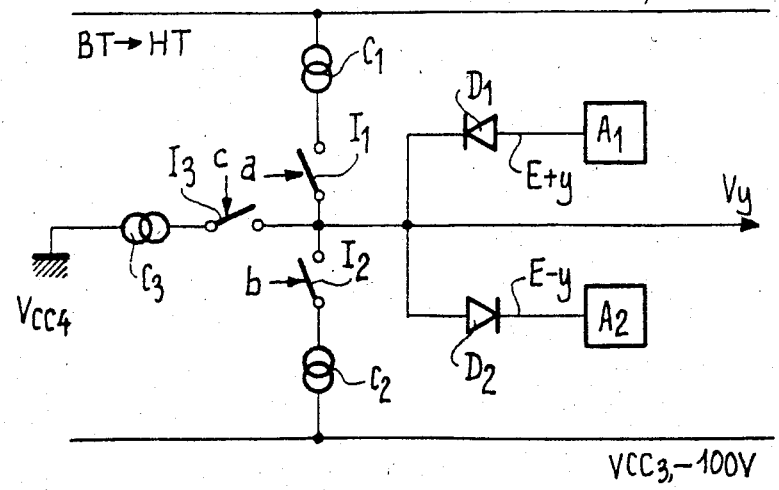
PRIOR ART FIG_2

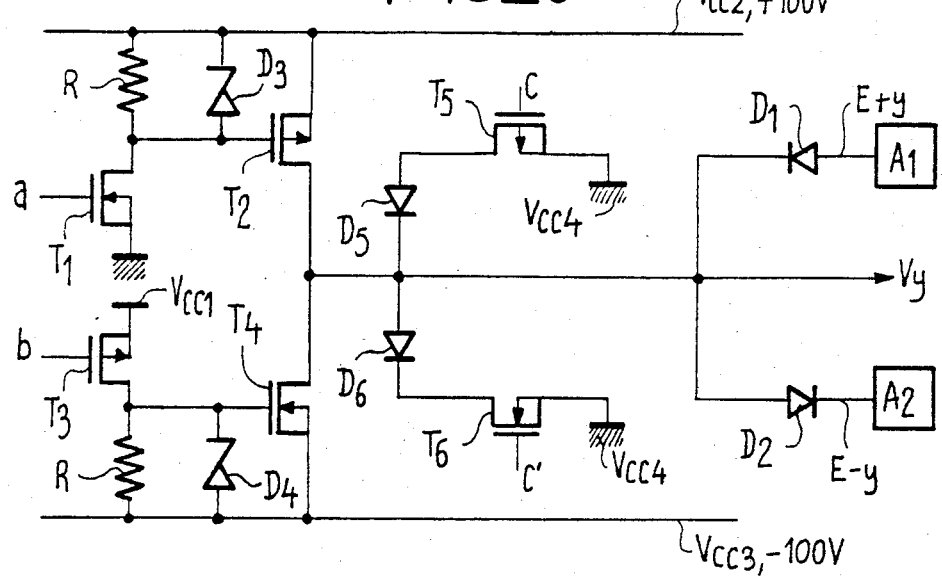
PRIOR ART FIG_3
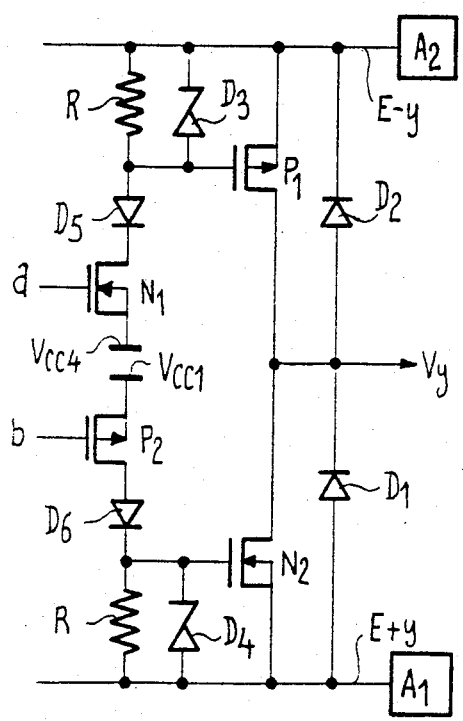
FIG_5
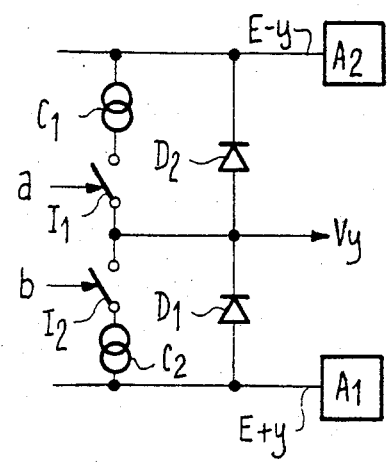
FIG_4

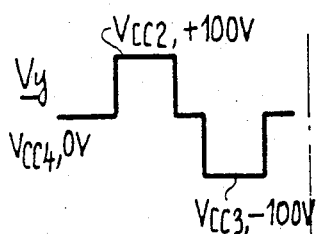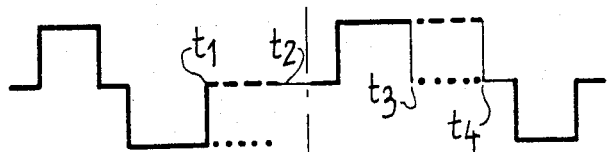
FIG_6-a
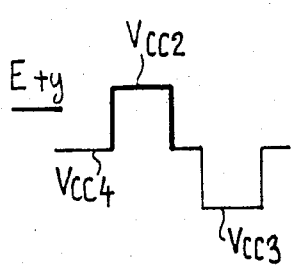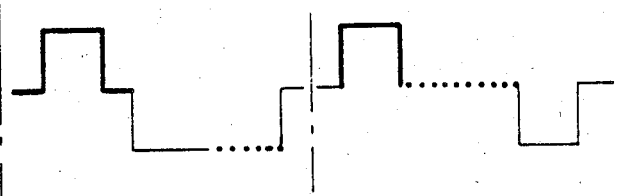
FIG_6-b
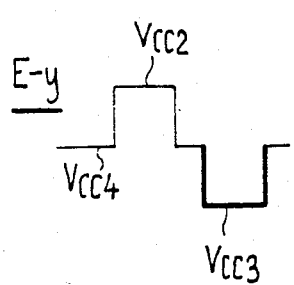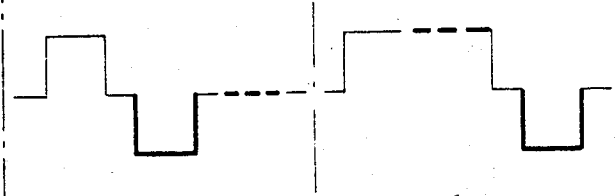
FIG_6-c
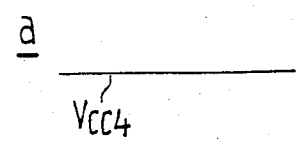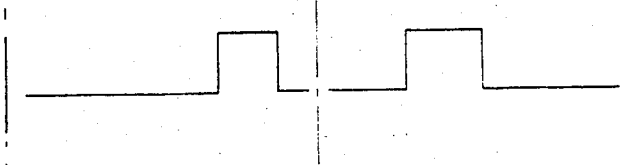
FIG_6-d
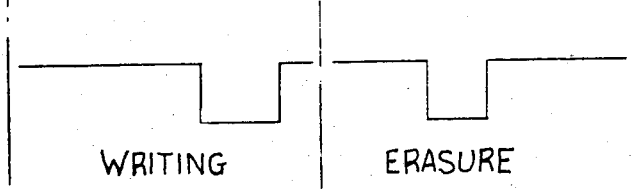
FIG_6-e
MAINTENANCE | WRITING | ERASURE

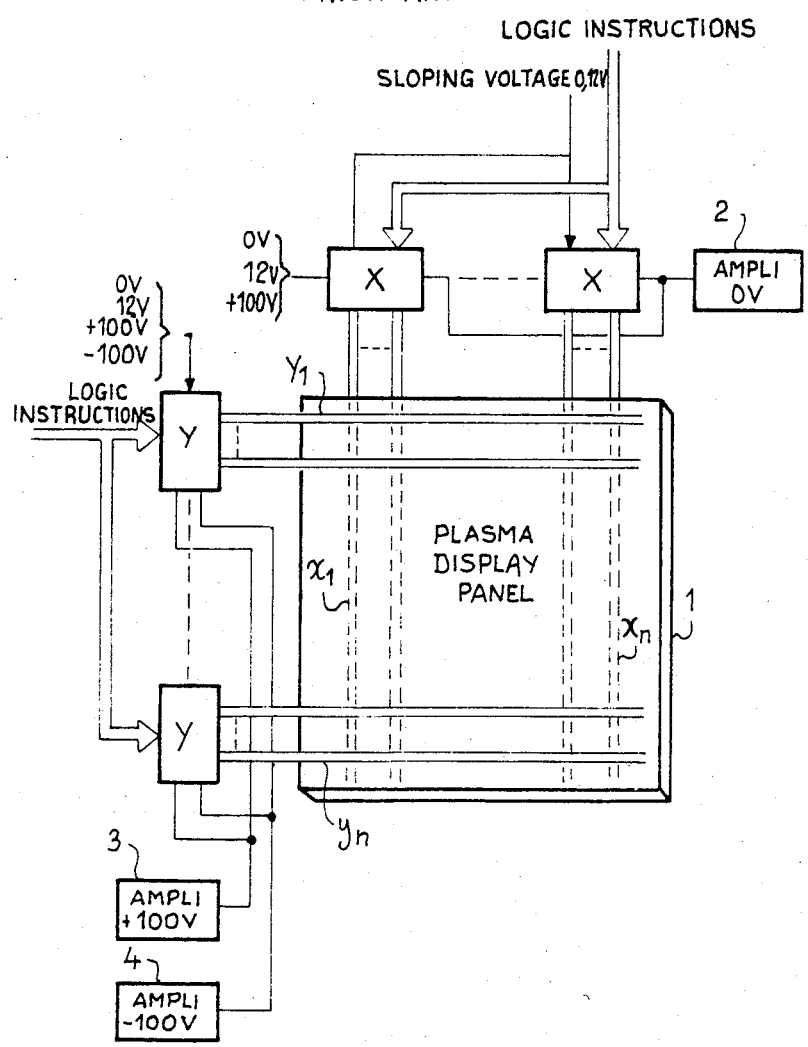
FIG_7
PRIOR ART

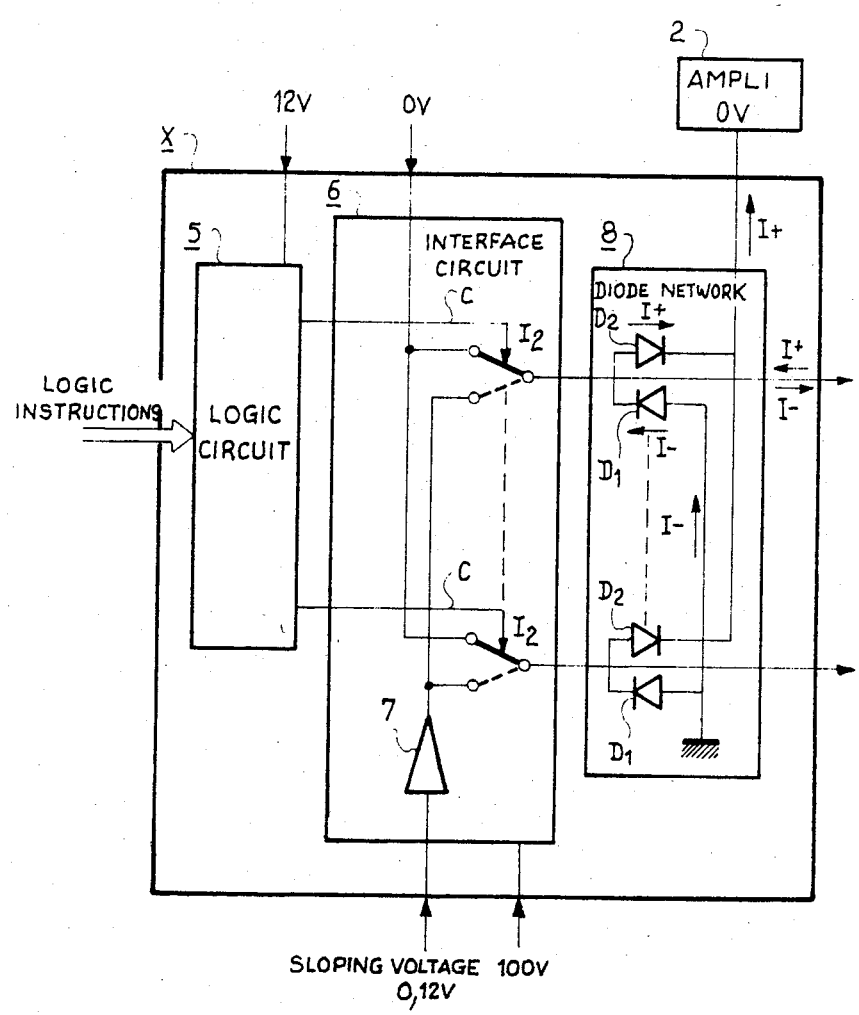
FIG_8
PRIOR ART

CONTROL CIRCUIT FOR AN ALTERNATE TYPE PLASMA PANEL

BACKGROUND OF THE INVENTION

The present invention relates to a control circuit for an alternate type plasma panel.

DESCRIPTION OF THE PRIOR ART

According to U.S. Pat. No. 4,575,721, Delgrange et al., issued Mar. 11, 1986, and corresponding French patent application filed on Oct. 23, 1981 under No. 81.19941 and published under No. 2.515.402, an alternate type plasma panel is already known.

FIGS. 1, 2 and 3 of the present application relate to the operation of the circuit described in the aforementioned U.S. Pat. No. 4,575,721 and French published patent application No. 2.515.402 to which reference will be made for further details.

A plasma panel comprises two orthogonal electrode networks, that are designated by the terms electrodes in x and electrodes in y.

The control signals of the panel -refreshing, writing and erasure signals- are applied between two electrodes belonging to respectives ones of the networks.

The control circuit described in French patent application No. 2.515.402 is constituted by integrated circuits and amplifiers.

The electrodes in x are controlled by integrated circuits that bear the reference X.

Each integrated circuit X is associated with a single amplifier.

The electrodes in y are controlled by integrated circuits that bear the reference Y.

Each integrated circuit Y is associated with two amplifiers.

The operation of the control circuit of the above-mentioned patent application can be summarized somewhat schematically by stating that the integrated circuits ensure the elaboration of writing and erasure signals of the panel and the amplifiers ensure the elaboration of the refreshing signals.

FIG. 1 is of the present application represents in a schematic manner an integrated circuit Y.

This integrated circuit comprises three parts : a logic circuit, a low voltage/high voltage interface circuit and a network of diodes.

The logic circuit receives low voltage logic instructions defining the signal to be executed, its duration and the electrodes of the panel to be addressed. This logic circuit is supplied by a direct voltage of 12 V, for example.

The low voltage/high voltage interface circuit, BT/HT on FIG. 1, is controlled by the logic circuit and serves, during elaboration of the writing and erasure signals, to bring each electrode of the panel to a given voltage. This circuit is supplied with high voltage by direct voltage sources outside the integrated circuit that supply the voltage values $V_{CC2}$, $V_{CC3}$ and $V_{CC4}$ equal, for example to $+100$ V, $-100$ V and 0 V.

Connected in series downstream of the low voltage/high voltage interface circuit, a network of diodes is present which ensures the connection between the outputs of the low voltage/high voltage interface circuit, the outputs $E_{+y}$ and $E_{-y}$ of the two amplifiers $A_1$ and $A_2$ outside the integrated circuit and the electrodes of the panel-connections $V_y$.

Each output of an interface circuit is connected to two oppositely poled diodes $D_1$ and $D_2$ connected in parallel.

The diode $D_1$ has its cathode connected to an output of the interface circuit and its anode connected to a connection $E_{+y}$.

The diode $D_2$ has its anode connected to an output of the interface circuit and its cathode connected to a connection $E_{-y}$.

FIG. 2 is a schematic representation of the arrangement of a low voltage/high voltage interface circuit in the case of the integrated circuit Y of FIG. 1.

Each interface circuit comprises three switches $I_1$, $I_2$ and $I_3$ that are controlled by respective signals a, b and c supplied by the logic circuit and which are each connected between an electrode of the panel (connection $V_y$) and a respective one of the three direct voltages $V_{CC2}$, $V_{CC3}$ and $V_{CC4}$. Each of these switches is mounted in series with a voltage source $C_1$, $C_2$ and $C_3$.

FIG. 2 also shows, although they do not form part of the low voltage/ high voltage interface circuit, the pair of diodes $D_1$ and $D_2$ associated with each low voltage/high voltage interface circuit and the amplifiers $A_1$ and $A_2$.

FIG. 3 represents an embodiment of the circuit shown schematically in FIG. 2.

The switches $I_1$ and $I_2$ and the current sources $C_1$ and $C_2$ are constituted by two MOS transistors supporting a high voltage or DMOS, bearing references $T_1$, $T_2$, $T_3$, $T_4$. Two resistances R and two zener diodes $D_3$ and $D_4$ must also be provided. Each DMOS acts as a switch in series with a current source. For a given voltage applied to its grid, it transmits one of the voltages $V_{CC2}$, $V_{CC3}$ to a connection $V_y$ and can supply a given drain-source current.

In order to realize the switch $I_3$ and the voltage source $C_3$, two transistors $T_5$ and $T_6$ controlled by respective signals c and c' and two diodes $D_5$ and $D_6$ are used. Two different types of transistors must be provided since upon elaboration of the selective signals it is necessary to be able to supply or receive current from each electrode. The diodes $D_5$ and $D_6$ are present in order to compensate for the effect of the intrinsic diodes of the transistors $T_5$ and $T_6$.

It will thus be observed that each low voltage/high voltage interface circuit of an integrated circuit Y requires the utilization of 6 DMOS and that, furthermore, the DMOS $T_2$ and $T_4$ must have appropriate dimensions so as to tolerate 200 V, i.e. ($V_{CC2} - V_{CC3}$), of reverse voltage. For the other components, the voltage to be tolerated is only 100 V, either $|V_{CC2}|$ or $|V_{CC3}|$.

The problems that the present invention proposes to overcome are the following:

reduction of the bulk of the control circuit;

decrease of the voltage that the components have to tolerate.

The various embodiments of the invention overcome partially or totally these problems.

SUMMARY OF THE INVENTION

According to the invention, the low voltage/high voltage interface circuits of the integrated circuits Y have been modified.

The integrated circuits X have not been modified with respect to what is set out in the above-mentioned U.S. Pat. No. 4,575,721 cf. especially FIG. 2 of said patent and its description.

The integrated circuits X comprise, like integrated circuits Y, a logic circuit, a low voltage/high voltage interface circuit and a network of diodes.

With respect to the integrated circuits Y, it should be noted that the low voltage/high voltage interface circuit of the integrated circuits X must only, during elaboration of the writing and erasure signals, bear each electrode of the panel at two states and not at three states, one state at 0 V or $V_{CC4}$ and a ramp of 0 to 100 V, from $V_{CC4}$ to $V_{CC3}$ It should also be noted that no component has to support 220 V reverse voltage.

The present invention concerns a control circuit of an alternate type plasma panel that ensures the elaboration of refreshing, writing and erasure SIGNALS OF THE PANEL. These signals are applied between two electrodes belonging respectively to two orthogonal electrode networks, a first electrode network being controlled by integrated circuits associated with a single amplifier and a second electrode network being controlled by integrated circuits associated with two amplifiers, these amplifiers being used for the elaboration of the refreshing signals. Each integrated circuit comprises especially a low voltage/high voltage interface circuit controlled by a logic circuit and comprising means serving especially during the elaboration of the writing and erasure signals, to bear each electrode of the panel at a given voltage, this interface circuit being followed by a network of diodes. According to claim 1, the low voltage/high voltage integrated circuits associated with the second electrode network are supplied with high voltage by the two amplifiers associated with each of these integrated circuits. During the elaboration of the writing and erasure signals, one of the amplifiers supplies the voltage to be applied, to the electrodes selected, to write or to erase, while the other amplifier supplies the voltage to be applied to the non-selected electrodes.

BRIEF DESCRIPTION OF THE DRAWINGS

Other objects, characteristics and results of the invention will appear from reading through the following description, given by way of non-limitative example and illustrated by the annexed drawings in which:

FIGS. 1, 2 and 3 are diagrams of the integrated circuits Y and the low voltage/high voltage interface circuits according to the prior art;

FIG. 4 is a block diagram according to the invention of the low voltage/high voltage interface circuits of the integrated circuits Y;

FIG. 5 illustrates one embodiment of the diagram of FIG. 4;

FIGS. 6a to 6e illustrate various signals supplied or received at the low voltage/high voltage interface circuits of the integrated circuits Y according to one embodiment of the invention.

FIGS. 7 and 8 are schematic diagrams of the basic circuit architecture as shown in U.S. Pat. No. 4,575,721.

On the different drawings, the same references designate the same elements but, for enhanced clarity, the sizes and proportions of the various elements have not been respected.

DESCRIPTION OF THE PREFERRED EMBODIMENT

FIG. 4 is a schematic diagram according to the invention of a low voltage/high voltage interface circuit utilized in an integrated circuit Y.

According to the invention, these interface circuits are supplied with high voltage by two amplifiers $A_1$ and $A_2$ associated with each integrated circuit Y. These interface circuits thus receive voltages $E_{+y}$ and $E_{-y}$ supplied by these two amplifiers $A_1$ and $A_2$. Two switches $I_1$ and $I_2$ controlled by respective low voltage logic signals a and b serve to apply to each electrode in y (connection $V_y$) either $E_{-y}$ when switch $I_1$ is on, or $E_{+y}$ when switch $I_2$ is on, for the elaboration of the writing and erasure signals. These switches are mounted in series with voltage sources $C_1$ and $C_2$. When the switches $I_1$, $I_2$ are off, the refreshing signals are elaborated as described in U.S. Pat. No. 4,575,721 mentioned hereinabove due to diodes $D_1$ and $D_2$ connected between, on the one hand, $V_y$ and, on the other hand, $E_{-y}$ and $E_{+y}$.

FIG. 4 shows in parallel between $V_y$ and $E_{-y}$, switch $I_1$, in series with the current source $C_1$ and the diode $D_2$ connected by its anode to $V_y$ and between $V_y$ and $E_{+y}$ in parallel to the switch $I_2$, in series with the current source $C_2$, and the diode $D_1$ connected by its cathode to $V_y$.

The operation of the device shown in FIG. 4 will be explained with reference to timing diagrams 6a to e.

These figures comprise three parts :
the left part relating to the refreshing or maintenance signals;
the central part relating to the writing signals;
the right part relating to the erasure signals.

FIG. 6a shows the signal $V_y$ applied to an electrode in y.

FIGS. 6b and c show the voltages $E_{+y}$ and $E_{-y}$ obtained at the output of the two amplifiers connected to each integrated circuit Y and applied according to the invention to each low voltage/high voltage interface circuit.

FIGS. 6d and e show the control signals a and b applied to the switches $I_1$ and $I_2$ of FIG. 4. As has been explained in U.S. Pat. No. 4,575,721 mentioned hereinabove, the refreshing signals, in steps of extreme values $V_{CC2}$ and $V_{CC3}$, equal for example to $+100$ V and $-100$ V and of the intermediary value $V_{CC4}$ equal for example to 0 V, are generated by two amplifiers 3,4 supplying voltages $E_{+y}$ and $E_{-y}$ identical to $V_y$.

Therefore, and due to diodes $D_1$ and $D_2$, one of the amplifiers supplies the current necessary to the plasma panel during the rising edges of the refreshing signals and the other amplifier receives the current from the panel during the trailing edges of the refreshing signal. The equality of voltages $E_{+y}$ and $E_{-y}$ means that there is no current circulation from $E_{+y}$ to $E_{-y}$ through the diodes.

FIGS. 6b and c represent, in heavy lines, the portions of the signals $E_{+y}$ and, $E_{-y}$ that are applied to the electrodes in y and in thin lines, the portions of the signals $E_{-y}$ and $E_{+y}$ that only act to prevent current circulation between $E_{+y}$ and $E_{-y}$, i.e. between the two amplifiers.

Therefore, the positive alternance of $E_{+y}$ is applied by the diode $D_1$ to an electrode in y, and consequently contributes to the elaboration of the positive alternance of the voltage $V_y$.

The same is true for the negative alternance of $E_{-y}$.

During the elaboration of the refreshing signals, the switches $I_1$ and $I_2$ are off. The refreshing signals are elaborated in the same way as that of the prior art where, as shown in the diagram of FIG. 2 of the present application, the switches $I_1$, $I_2$ and $I_3$ were off at this moment.

According to the invention, the applicant has taken advantage of the following considerations.

In the case of FIG. 2, during the elaboration of the refreshing signals, by the amplifiers, the switches $I_1$, $I_2$ and $I_3$ are off and during the elaboration of the writing and erasure signals, it is necessary that the voltages $E_{+y}$ and $E_{-y}$ at the output of the amplifiers are such that they do not impose voltages on the low voltage/high voltage interface circuits that must supply these signals. FIG. 6a represents the writing and erasure signals to be elaborated. The parts in broken lines concern the case where an electrode must be written or erased. The parts in dashed lines concern the opposite case, where the electrode must be refreshed in the same state.

FIGS. 6b and c represent the voltages $E_{+y}$ and $E_{-y}$ that must supply the amplifiers, during the elaboration of the writing or erasure signals so that the amplifiers do not impose any voltage on the electrodes in y.

The following conditions must be satisfied:

$$E_{+y} \leq V_y$$

$$E_{-y} \geq V_y$$

taking into consideration the fact that $E_{+y}$ is positive and $E_{-y}$ is negative.

$E_{+y}$ and $E_{-y}$ are taken equal to $V_y$ except in the zones where $V_y$ can take two values. There, $E_{+y}$ takes the lower of these values and $E_{-y}$ is the higher.

The applicant has noted that, for writing as well as for erasure, the voltage $E_{+y}$ is equal to the voltage $V_y$ —in broken lines- to be applied to selected electrodes and the voltage $E_{-y}$ is equal to the voltage $V_y$ —in dashed lines- to be applied to the non-selected electrodes.

According to the present invention, the $+100$ V, $-100$ V direct voltage of FIG. 2 are no longer used and the voltages $E_{+y}$ and $E_{-y}$ to elaborate the writing and erasure signals are utilized in each low voltage/high voltage interface circuit. The voltages $E_{+y}$ and $E_{-y}$ have not been modified. They will simply have to supply the necessary energy to the selective signals during their elaboration while the amplifiers were passive in the prior art, during the elaboration of the selective signals. The voltages necessary for the writing and the erasure being very inferior to those of the refreshing, this will not require over-sizing of the amplifiers creating $E_{+y}$ and $E_{-y}$.

For example, during the time interval $t_1$, $t_2$ allowed for the writing:

when an electrode in y must be written therein, the switch $I_2$ is closed to apply $E_{+y}$ to the electrode and to have $$V_y = E_{+y}.$$

The switch $I_2$ is in parallel with the diode $D_1$ and imposes at the electrode in y a voltage of $-100$ V that the diode $D_1$ would not permit to apply thereto, the diode $D_2$ is in reverse.

When an electrode in y must not be written, the switch $I_1$ is closed to apply $E_{-y}$ to the electrode and to have $$V_y = E_{-y}.$$

The switch $I_1$ is in parallel with the diode $D_2$ and imposes at the electrode in y a voltage of 0 V that the diode $D_2$ would not allow to apply thereto, the doide $D_1$ is in reverse.

During the time interval $t_3$, $t_4$ allowed for the erasure:

when an electrode in y must be erased, the switch $I_2$ is closed to have $V_y = E_{+y}$. Furthermore, the switch $I_2$ imposes on the electrode in y a voltage of 0 V that the diode $D_1$ would not have allowed to apply. The diode $D_2$ is in reverse.

when an electrode in y must not be erased, the switch $I_1$ is closed to have $V_y = E_{-y}$. Furthermore, the switch $I_1$ imposes on the electrode in y a voltage of 100 V that the diode $D_2$ would not have allowed to apply. The diode $D_1$ is in reverse.

The control signals a and b that control the switches $I_1$ and $I_2$ are identical for the writing and the erasure. The invention thus permits simplifying the logic circuits of the integrated circuits that supply a and b.

The invention serves to reduce the number of switches and the current sources. On FIG. 4, only two switches and two voltage sources are utilized whereas three are used on FIG. 3.

Furthermore, it will be noted that on FIG. 6 there is a maximum of 100 V difference of potential between $E_{+y}$ and $E_{-y}$ i.e. superior to $|V_{CC2}|$, and to $|V_{CC3}|$. No component must tolerate 200 V in reverse voltage, i.e. $|V_{CC2}| + |V_{CC3}|$ as was the case on FIG. 2.

The dimensions of all the components allow them to support a reverse voltage maintenance of 100 V, i.e. superior to $|V_{CC2}|$ and to $|V_{CC3}|$.

The invention thus permits generating amplitude output signals $(V_{CC4}, V_{CC2})$ and $(V_{CC4}, V_{CC3})$ with components having dimensions for reverse voltage superior to $|V_{CC2}|$ and to $|V_{CC3}|$ instead of components having to support tolerate $|V_{CC2}| + |V_{CC3}|$.

This represents an appreciable gain in the dimensions of the components and this serves to exceed the voltage limits imposed by the technology of the integrated components.

Therefore, in the numerical example selected, total amplitude signals 200 V are created from components tolerating 100 V.

It must be noted that this occurs without causing the reference voltage $V_{CC4}$ of the circuit to float. This latter point is very important since the invention in no way modifies the operation of the logic circuit of the integrated circuit, this latter being always referenced with respect to the constant voltage $V_{CC4}$ FIG. 5 represents an embodiment of the block diagram of FIG. 4.

As in the case of FIG. 3, each switch has been formed, associated with a voltage source, by two DMOS $N_1$ and $P_1$ for $I_1$ and $N_2$ and $P_2$ for $I_2$.

The P type transistor $P_1$ is connected between the output $E_{-y}$ of amplifier $A_2$ and $V_y$.

Between $E_{-y}$ and the grid of $P_1$, a resistance R and a zener diode $D_3$ are mounted in parallel.

The grid of $P_1$ is connected through the intermediary of a diode $D_5$ to the N type transistor $N_1$ of which the grid receives the control signal a and of which the source is connected to $V_{CC4}$ equal, for example, to 0 V.

The diode $D_5$ is present to compensate the effect of the intrinsic diode of the transistor $N_1$. Without the diode $D_5$, this intrinsic diode would pass in direct when $E_{-y}$ becomes inferior to $V_{CC4}$ and would provoke a circulation of current $V_{CC4}$ towards $E_{-y}$.

The lower part of FIG. 5 comprises a system similar to that of its upper part, with transistors $P_2$ and $N_2$, the diodes $D_4$ and $D_6$ and the resistance R, but the types of transistors are reversed and the sign of signal b is the reverse of that of a.

Between $E_{-y}$, output of the amplifier $A_2$, and $V_y$, there is the diode $D_2$ and between $E_{+y}$, output of the amplifier $A_1$, and $V_y$, there is the diode $D_1$, as represented in FIG. 4.

When the transistor $N_1$ leads, there is a current circulation that actuates the zener diode $D_3$, which provokes the conduction of the transistor $P_1$. The switch $I_1$ is on. The voltage $E_{-y}$ is thus applied in $V_y$ and a current is supplied to an electrode.

Conversely, when $N_1$ is blocked, by the resistance R connected to $E_{-y}$, the transistor $P_1$ is blocked. The switch $I_1$ is off.

The system of the lower part of FIG. 5 operates in the same way as that of the upper part.

It is, of course, understood that the diagram of FIG. 4 can be realized by using another technology, such as a bipolar technology, for example.

Diodes $D_1$ and $D_2$ are in parallel on the drain source-intrinsic diodes of the transistors $P_1$ and $N_2$. The diodes $D_1$ and $D_2$ can be suppressed and the intrinsic diodes $P_1$ and $N_2$ be strengthened so that they can support the currents necessary for the refreshing signals. This also serves to reduce the dimensions of the control circuit.

During the writing interval, i.e. from $t_1$ to $t_2$, it is necessary in order to control the transistor $P_1$ to apply thereto a grid voltage lower than its source voltage.

If the output $E_{-y}$ is at 0 V, it is necessary to apply on the grid of $P_1$ a negative voltage. It is thus necessary that the source of the transistor $N_1$ is at a negative potential, equal to $-V_{CC1}$, for example, therefore making it necessary to dispose of a low voltage direct voltage equal to $-V_{CC1}$. It is also necessary to relocate the level of the control signal a between $-V_{CC1}$ and 0 V.

It is possible to proceed differently by leaving the source of $N_1$ at ground, i.e. at $V_{CC4}$ and by creating a "step" of several volts, equal to $+V_{CC1}$, for example, at the output $E_{-y}$ of the amplifier $A_2$ during the writing. The operating range of the plasma panel is not reduced, but it is necessary to modify slightly the amplifier $A_2$ by adding to it the low power necessary to create this "step".

The diagrams of FIGS. 4 and 5 can, of course, be implemented as either integrated circuits or discrete digital components.

When, as is more often the case, the low voltage/high voltage interface circuits of FIGS. 4 and 5 are implemented as an integrated circuit Y also comprising a logic circuit and diode networks such as represented in FIG. 1, it is necessary to ensure the polarization of the substrate of the integrated circuit.

The voltages applied to this integrated circuit vary between $-100$ V, $V_{CC3}$ and $+100$ V, $V_{CC2}$ and it is necessary that the substrate of the integrated circuit be at the most negative voltage of the circuit.

Two solutions may then be envisaged:

either to place the substrate at a constant potential of $-100$ V.

It is therefore necessary to dispose for the supply of the substrate of a direct voltage equal to $-100$ V, $V_{CC3}$. Furthermore, this requires providing components tolerating 200 V, either $|V_{CC2}|+|V_{CC3}|$ with respect to the substrate;

or creating for the substrate a supply in steps varying between $V_{CC4}$ and $V_{CC3}$, 0 V and $-100$ V, and synchronized on $E_{+y}$ and $E_{-y}$, in such a way that the substrate of the integrated circuit is always at the most negative voltage. It is therefore sufficient to dispose of components supporting 100 V with respect to the substrate.

In the preceding description, voltages equal to $V_{CC1}$, $V_{CC2}$, $V_{CC3}$ and $V_{CC4}$ equal respectively to 12 V, $+100$ V, $-100$ V and 0 V have been taken. It is well understood that these voltages are merely exemplary and can take different values.

We claim:

1. In an alternate-type plasma display panel (1) having
    a first network of parallel electrodes (X);
    a single amplifier (2) connected to said first network (X);
    a second network of parallel electrodes (Y) spaced from and orthogonal to said first network;
    two amplifiers (3,4) connected to said second network (Y);
    a plurality of display cells, each located at an intersection between an electrode of each of said first and second networks and adapted to be illuminated by application of differing voltages to said electrodes;
    at least one logic circuit (5) for each network (X,Y), receiving low-voltage logic instructions or orders to selectively write or illuminate, to erase or extinguish, and to refresh or maintain particular display cells, and generating corresponding control signals;
    at least one low voltage/high voltage interface circuit (6) connected to an output of each logic circuit (5) and applying high-voltage, in accordance with said control signals, to display cell electrodes ordered illuminated; and
    a network (8) of diodes connected to the output of each interface circuit (6);
    the improvement comprising a control circuit including
    means for setting, during the elaboration of writing and erasure signals, each electrode of the panel to a selected voltage, and
    wherein the low voltage/high voltage interface circuits (6) associated with the second electrode network (Y) are supplied with high voltage by the two amplifiers (3,A1; 4,A2) associated therewith; and
    wherein, during the elaboration of the writing and erasure signal, one (3, A1) of the amplifiers (3,A1; 4,A2) supplies the voltage to be applied to the selected electrodes, to be written or to be erased, while the other amplifier (4, A2) supplies the voltage to be applied to the non-selected or maintained electrodes.

2. An improved and simplified control circuit as set forth in claim 1,
    wherein (FIG. 4) each low voltage/high voltage interface circuit (6) associated with the second electrode network (Y) comprises
    no more than two switches, controlled by a logic circuit (5), and each in series with
    a respective current source (C1,C2), each switch (I1,I2) and its respective current source being connected in parallel with a respective diode (D2,D1) of the diode network (8), between
    an output of a respective one of the two amplifiers (3,A1; 4,A2) associated with said second network (Y) and one of the electrodes (Vy) of the network.

3. Circuit according to claim 2, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a direct current source.

4. Circuit according to claim 2, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a "step" supply, synchronized to the outputs of the amplifiers.

5. Circuit according to claim 2, wherein (FIG. 5)
   each switch (I1,I2) in series with a current source (C1,C2) comprises
   a first MOS transistor (P1,N2) capable of tolerating a high voltage, connected between the output of one of the amplifiers (A2,A1) and one of the electrodes (Vy) of the second network (Y);
   a resistance (R) and a zener diode (D3,D4), each connected in parallel to a path between the grid of said first transistor (P1,N2) and the terminal of said first transistor connected to said amplifier output;
   a second MOS transistor (N1,P2), of a different type from the first, capable of tolerating a high voltage, connected between the grid of said first transistor (P1,N2) and a polarization voltage (VCC1, VCC4) and thus in series with said resistance and zener diode, and controlled (a,b) by said logic circuit (5).

6. Circuit according to claim 5, wherein
   a diode (D5,D6) is mounted between the grid of the first transistor (P1,N2) and the second transistor (N1,P2) to compensate for the effect of the intrinsic diode of the second transistor.

7. Circuit according to claim 3, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a direct current source.

8. Circuit according to claim 3, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a "step" supply, synchronized to the outputs of the amplifiers.

9. Circuit according to claim 4, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a direct current source.

10. Circuit according to claim 4, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a "step" supply, synchronized to the outputs of the amplifiers.

11. Circuit according to claim 1, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a direct current source.

12. Circuit according to claim 1, wherein said logic circuit (5), interface circuit (6), and diode network (8) are implemented as a single integrated circuit associated with said two amplifiers (3,A1; 4,A2), said integrated circuit being formed on a substrate, said substrate being brought to the most negative voltage of the circuit by a "step" supply, synchronized to the outputs of the amplifiers.

* * * * *